US011289545B2

(12) United States Patent
Wang et al.

(10) Patent No.: US 11,289,545 B2
(45) Date of Patent: Mar. 29, 2022

(54) COLOR FILTER SUBSTRATE CAPABLE OF PROTECTING ELECTRODE, MANUFACTURING METHOD THEREOF AND DISPLAY PANEL

(71) Applicant: BOE TECHNOLOGY GROUP CO., LTD., Beijing (CN)

(72) Inventors: Linlin Wang, Beijing (CN); Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 147 days.

(21) Appl. No.: 16/649,073

(22) PCT Filed: Apr. 16, 2019

(86) PCT No.: PCT/CN2019/082790
§ 371 (c)(1),
(2) Date: Mar. 19, 2020

(87) PCT Pub. No.: WO2019/210773
PCT Pub. Date: Nov. 7, 2019

(65) Prior Publication Data
US 2020/0273917 A1    Aug. 27, 2020

(30) Foreign Application Priority Data

May 4, 2018  (CN) .......................... 201810434263.1

(51) Int. Cl.
*H01L 27/32*   (2006.01)
*H01L 51/52*   (2006.01)
*H01L 51/56*   (2006.01)

(52) U.S. Cl.
CPC ........ *H01L 27/322* (2013.01); *H01L 27/3246* (2013.01); *H01L 51/5284* (2013.01); *H01L 51/56* (2013.01); *H01L 2227/323* (2013.01)

(58) Field of Classification Search
USPC .......................................................... 257/40
See application file for complete search history.

(56) References Cited

U.S. PATENT DOCUMENTS

| 2009/0046227 A1* | 2/2009 | Fan Jiang ......... G02F 1/133707 349/114 |
| 2016/0033803 A1 | 2/2016 | Zhang |

(Continued)

FOREIGN PATENT DOCUMENTS

| CN | 103792735 A | 5/2014 |
| CN | 103972270 A | 8/2014 |

(Continued)

OTHER PUBLICATIONS

First Office Action and English language translation, CN Application No. 201810434263.1, dated Mar. 3, 2020, 14 pp.

(Continued)

*Primary Examiner* — Nduka E Ojeh
(74) *Attorney, Agent, or Firm* — Myers Bigel, P.A.

(57) ABSTRACT

A color filter substrate, a manufacturing method thereof and a display panel are provided. The color filter substrate includes a first substrate, at least one spacer on a side of the first substrate, at least one electrode on a side of the at least one spacer facing away the first substrate, and at least two elastic supports on the side of the first substrate. In a plane parallel with an extending plane of the first substrate, a periphery of each spacer comprises at least two of the elastic supports, and in a direction perpendicular to the extending plane of the first substrate, a sum of a height of the spacer and a thickness of the electrode on the spacer is smaller than a height of each of the elastic supports in the periphery of the spacer.

20 Claims, 3 Drawing Sheets

(56) References Cited

U.S. PATENT DOCUMENTS

| | | | |
|---|---|---|---|
| 2016/0035980 A1* | 2/2016 | Kong | H01L 51/5228 257/40 |
| 2016/0181566 A1* | 6/2016 | Wang | H01L 51/525 257/40 |
| 2016/0276617 A1 | 9/2016 | Qi et al. | |
| 2019/0067391 A1* | 2/2019 | Li | H01L 27/3246 |
| 2020/0273917 A1 | 8/2020 | Wang et al. | |

FOREIGN PATENT DOCUMENTS

| | | |
|---|---|---|
| CN | 104078491 A | 10/2014 |
| CN | 104793405 A | 7/2015 |
| CN | 107394052 A | 11/2017 |
| CN | 108598126 A | 9/2018 |

OTHER PUBLICATIONS

Second Office Action and English language translation, CN Application No. 201810434263.1, dated Aug. 31, 2020, 12 pp.
International Search Report with English language translation, International Application No. PCT/CN2019/082790, dated Jul. 29, 2019, 6 pp.

* cited by examiner

COLOR FILTER SUBSTRATE CAPABLE OF PROTECTING ELECTRODE, MANUFACTURING METHOD THEREOF AND DISPLAY PANEL

CROSS REFERENCE TO RELATED APPLICATIONS

The present application is a 35 U.S.C. 371 national stage application of a PCT International Application No. PCT/CN2019/082790, filed on Apr. 16, 2019, which claims the priority of Chinese patent application 201810434263.1 filed on May 4, 2018, the entire disclosures of which are incorporated herein by reference.

TECHNICAL FIELD

This disclosure relates to the field of display technologies, and specifically to a color filter substrate, a manufacturing method thereof and a display panel.

BACKGROUND

In an OLED display panel, if the external lines are too long or too thin, a serious voltage gradient will easily occur on the external lines such that the voltage actually reaching the OLED elements is lower. As OLED elements are current-driven devices, the drop in the external voltage will lead to a reduced light intensity of the display panel.

SUMMARY

According to an aspect of this disclosure, a color filter substrate is provided. The color filter substrate comprises: a first substrate; at least one spacer on a side of the first substrate; at least one electrode on a side of the at least one spacer facing away the first substrate, and at least two elastic supports on the side of the first substrate. In a plane parallel with an extending plane of the first substrate, a periphery of each spacer comprises at least two of the elastic supports, and in a direction perpendicular to the extending plane of the first substrate, a sum of a height of the spacer and a thickness of the electrode on the spacer is smaller than a height of each of the elastic supports in the periphery of the spacer.

According to an embodiment of the disclosure, in the plane parallel with the extending plane of the first substrate, the at least two of the elastic supports are evenly distributed in the periphery of the spacer.

According to an embodiment of the disclosure, each elastic support of the elastic supports comprises a rigid segment and an elastic segment connected with each other, the rigid segment is closer to the first substrate than the elastic segment.

According to an embodiment of the disclosure, in the direction perpendicular to the extending plane of the first substrate, a height of the rigid segment is ¼ to ⅓ of the height of the elastic support.

According to an embodiment of the disclosure, the rigid segment comprises silica gel and a nanomaterial, the nanomaterial comprises at least one of nanopillars and nanospheres, and the elastic segment comprises silica gel.

According to an embodiment of the disclosure, in the plane parallel with the extending plane of the first substrate, a distance between each spacer and the elastic support in the periphery is in a range of 0-0.5 micrometers.

According to an embodiment of the disclosure, in the direction perpendicular to the extending plane of the first substrate, the sum of the height of the spacer and the thicknesses of the electrode on the spacer is 0.3-0.5 micrometers smaller than the height of the elastic support in the periphery of the spacer.

According to an embodiment of the disclosure, in the plane parallel with the extending plane of the first substrate, the elastic support has a size of 5-10 micrometers.

According to an embodiment of the disclosure, the color filter substrate further comprises a black matrix layer between the first substrate and the at least one spacer, the black matrix layer comprising a plurality of first openings spaced apart from each other. An orthogonal projection of a portion of the black matrix layer between two adjacent first openings of the plurality of first openings on the first substrate covers an orthogonal projection of each spacer and the elastic support in the periphery of the spacer on the first substrate.

Another aspect of the disclosure provides a display panel comprising the color filter substrate according to any of the foregoing embodiments.

According to an embodiment of the disclosure, the display panel further comprises an array substrate opposite to the color filter substrate. The array substrate comprises a second substrate, a thin film transistor array, a pixel defining layer and a cathode layer stacked sequentially in a direction towards the color filter substrate, the pixel defining layer comprises a plurality of second openings, each second opening of the plurality of second openings is provided with an anode and an organic light emitting layer stacked on each other, and the electrode of the color filter substrate is in contact with the cathode layer of the array substrate due to a contraction of the elastic support.

Yet another aspect of the disclosure provides a method for manufacturing a color filter substrate, comprising: forming at least one spacer on a side of a first substrate; forming at least one electrode on a side of the at least one spacer facing away the first substrate, and forming, in a plane parallel with an extending plane of the first substrate, at least two elastic supports in a periphery of each spacer. In a direction perpendicular to the extending plane of the first substrate, a sum of a height of the spacer and a thickness of the electrode on the spacer is smaller than a height of each of the elastic supports in the periphery of the spacer.

According to an embodiment of the disclosure, forming the at least two elastic supports comprises arranging the at least two elastic supports evenly in the periphery of the spacer.

According to an embodiment of the disclosure, forming the at least two elastic supports comprises: mixing silica gel, a nanomaterial and a solvent to obtain an ink, and applying the ink to the periphery of the spacer by inkjet printing and baking the ink to form the elastic supports, the nanomaterial comprises at least one of nanopillars and nanospheres.

According to an embodiment of the disclosure, the ink contains 5-10% of the nanomaterial and 30-40% of the silica gel in percentage by mass, and a rest of the ink is the solvent.

DETAILED DESCRIPTION OF EMBODIMENTS

The embodiments of this disclosure will be described in detail. The embodiments described below are exemplary and only for explaining this disclosure instead of being construed as limiting this disclosure in any sense. Where specific techniques or conditions are not specified in the embodiments herein, techniques or conditions described in the documents of the art or the specification of the product will be referred to. Reagents or instruments without specified producers are all conventional products available on the market.

In order to avoid the disadvantageous phenomenon of an overly low voltage of the OLED element caused by external lines that are too long or too thin, an auxiliary electrode may generally be added to reduce a voltage gradient on the external circuit, thereby enhancing the lighting efficient of the OLED display panel and increasing the driving voltage for the OLED element.

In order to add the auxiliary electrode, spacers are usually fabricated on a color filter substrate, and electrodes are formed on a surface of the spacers. In this way, the electrodes are in contact with cathodes of an array substrate by lamination, thereby achieving overlapping joint. However, since there is a filling layer between the array substrate and the color filter substrate, the spacer material can hardly be highly elastic, so damage may be caused to the spacer during the process due to an overly large force, which will give rise to defects. Correspondingly, poor contact or no contact may be caused if the force is overly small, which will give rise to the problem of unevenness of the image displayed on the display panel.

In regard to the above technical problems, the inventor has found through thorough studies that at least two elastic supports can be arranged in the periphery of each spacer (in particular, evenly). Besides, a height of the elastic supports may be greater than a sum of the heights of the spacer and the electrodes on the spacer. Thereby, due to the elastic supporting function of the elastic supports, the electrodes can be effectively prevented from being squashed, and effective connection between the electrodes of the color filter substrate and the cathodes of the array substrate can be achieved.

Figure 1:
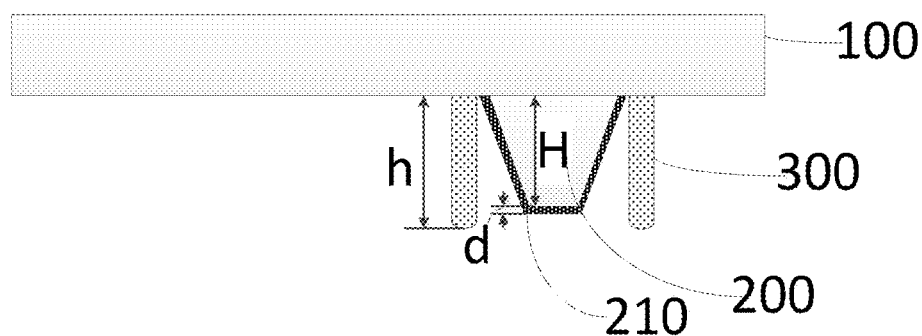
FIG. 1 is a schematic view of a color filter substrate according to an embodiment of this disclosure.

In view of this, according to an aspect of this disclosure, an embodiment provides a color filter substrate. According to an embodiment of this disclosure, referring to FIG. 1, the color filter substrate comprises: a substrate 100; at least one spacer 200; and at least two elastic supports 300. Specifically, the spacers 200 are provided on a lower side of the substrate 100, and on a lower surface of the spacers 200 (i.e., the surface facing away the substrate 100) electrodes 210 are further provided. Furthermore, the at least two elastic supports 300 are arranged on the same side (e.g. the lower surface) of the substrate 100 as the spacers 200. Besides, in the periphery of each of the spacers 200, at least two of the elastic supports 300 are arranged. In particular, the at least two elastic supports 300 can be arranged evenly along the periphery of the spacer 200. Besides, the height h of each of the elastic supports 300 is greater than the sum of the height H of the spacer 200 and the thickness d of a corresponding electrode 210. According to the embodiment of this disclosure, the color filter substrate has a simple structure and can be easily fabricated. When such a color filter substrate is aligned with an array substrate, a good connection effect can be achieved between the electrodes of the color filter substrate and the cathodes of the array substrate. Meanwhile, because of the elastic supports, the electrodes of the color filter substrate and the cathodes of the array substrate will hardly be damaged. Moreover, by arranging elastic supports in the periphery of each spacer, damage to the electrodes of the color filter substrate or the cathodes of the array substrate by the spacer can be avoided effectively, thereby improving the yield.

It should be noted that the expression of "the height of each elastic support is greater than the sum of the height of the spacer and the corresponding electrode" means that a distance from a surface of the elastic support facing away the substrate to the substrate is greater than the distance from the surface of the electrode on the spacer facing away the substrate to the substrate.

Figure 2:
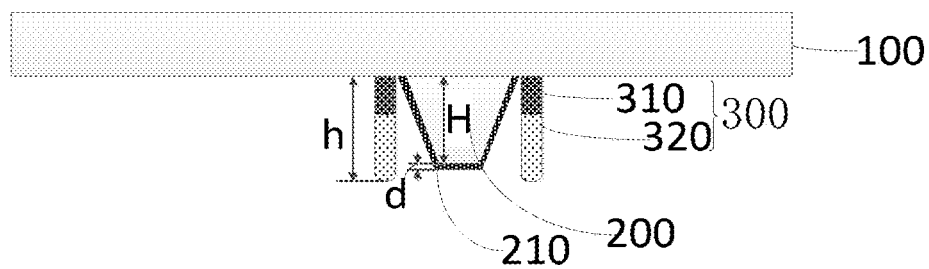
FIG. 2 is a schematic view of a color filter substrate according to another embodiment of this disclosure.

According to an embodiment of this disclosure, in order that the elastic supports have suitable elasticity, referring to FIG. 2, the elastic support 300 may comprise a rigid segment 310 and an elastic segment 320 connected with each other. Specifically, the rigid segment 310 is closer to the substrate 100 than the elastic segment 320 is. In this way, the elastic segment can be effectively supported by the rigid segment in the elastic support, but not overly deformed during the assembly of the array substrate and color substrate. Finally, on one hand, connection between the electrodes of the color filter substrate and the cathodes of the array substrate is achieved by means of the spacer; on the other hand, disadvantageous damage to the electrodes or the cathodes by the spacers can be effectively avoided. According to an embodiment of this disclosure, the material for forming the rigid segment may comprise silica gel and a nanomaterial, the nanomaterial is selected from at least one of nanopillars (e.g., the nanopillars may comprise but are not limited to nano-pillar zirconia, etc.) and nanospheres (e.g., the nanospheres may comprise but are not limited to carbon nanotubes). Thereby, the rigid segment formed with the above nanomaterial will have both good rigidity and satisfying supporting effects. Meanwhile, the formed elastic support will have high accuracy. According to an embodiment of this disclosure, the material for forming the elastic segment comprises silica gel. Thereby, the formed elastic segment will have a suitable elasticity, and be appropriately deformed under the support of the rigid segment, thereby achieving a good use performance.

According to an embodiment of this disclosure, in order to obtain an elastic support with more suitable elasticity, the height of the rigid segment may be ¼ to ⅓ of the total height of the elastic support. Therefore, the rigid segment has a good supporting effect, and meanwhile the elastic segment has a suitable elasticity. In this case, when the color filter substrate and the array substrate are aligned and assembled, the elastic support can be appropriately deformed. Finally, on one hand, connection between the electrodes of the color filter substrate and the cathodes of the array substrate can be achieved, and meanwhile, on the other hand, the electrodes or the cathodes can be effectively protected against damage by the spacers. If the ratio of the height of the rigid segment to the total height of the elastic support is too low, the elastic support has a poor supporting effect, and thus the electrodes or the cathodes may easily be squashed by the spacers during the aligning and assembling process since the elastic segment is excessively deformed. However, it is still better than the case where the color filter substrate comprises no elastic support. In contrast, when the ratio of the height of rigid segment to the total height of the elastic support is too high, the elastic segment has a poor elasticity. Therefore, the elastic segment may easily damage the cathodes of the array substrate. Likewise, it is still better than the case where the color filter substrate comprises no elastic support.

According to an embodiment of this disclosure, the height of the elastic support is 0.3-0.5 micrometers greater than the sum of the height of the spacer and the thickness of the electrode. For example, the height of the elastic support can be greater than the sum of the height of the spacer and the thickness of the electrode by 0.3 micrometers, 0.32 micrometers, 0.34 micrometers, 0.36 micrometers, 0.38 micrometers, 0.4 micrometers, 0.42 micrometers, 0.44 micrometers, 0.46 micrometers, 0.48 micrometers, 0.5 micrometers, and so on. Thereby, the elastic support has a better supporting effect, and can further effectively prevent the spacers from damaging the electrodes or the cathodes when the color filter substrate and the array substrate are being aligned and assembled with each other. Moreover, the elastic support will hardly damage the cathodes of the array substrate so that the contact effect between the electrodes of the color filter substrate and the cathodes of the array substrate is better. When the height of the elastic support significantly differs from the sum of the height of the spacer and the thickness of the electrode, the contact effect between the electrode and the cathode may not be ideal during the assembling process since the height of the elastic support is too large. However, it is still better than the effect in a case where the color filter substrate comprises no elastic support. Correspondingly, when the height of the elastic support does not sufficiently differ from the sum of the height of the spacer and the thickness of the electrode, the elastic support cannot have an effective supporting effect, which will easily result in damage to the electrode or the cathode by the spacers. However, it is still better than the case where the color filter substrate comprises no elastic support.

According to an embodiment of this disclosure, the elastic support has a size (e.g., a width) of 5-10 micrometers in an extending plane of the color filter substrate. For example, the width of the elastic support can be 5 micrometers, 6 micrometers, 7 micrometers, 8 micrometers, 9 micrometers, 10 micrometers, and so on. On one hand, the elastic support having a width within the above range will not affect light travelling in the display device, and meanwhile, on the other hand, damage to the electrodes or the cathodes by the spacers can be effectively avoided. When the width of the elastic support is too great, the cathode of the array substrate can be easily squashed during the aligning and assembling process due to an excessively strong elasticity of the elastic support, and thus light to exit may be shielded. However, it is still better than the case where the color filter substrate does not comprise the elastic support. In contrast, in case the width is too small, an effective supporting effect cannot be achieved during the aligning and assembling process such that the spacers are apt to damage the electrodes or the cathodes. However, it is still better than the case where the color filter substrate does not comprise the elastic support. According to an embodiment of this disclosure, for convenience of manufacture, the elastic supports and the spacers are spaced apart from each other, e.g., by a spacing distance of 0-0.5 micrometers. Thereby, an elastic support can be conveniently fabricated. Moreover, it will affect light exiting the color filter substrate.

Figure 3:
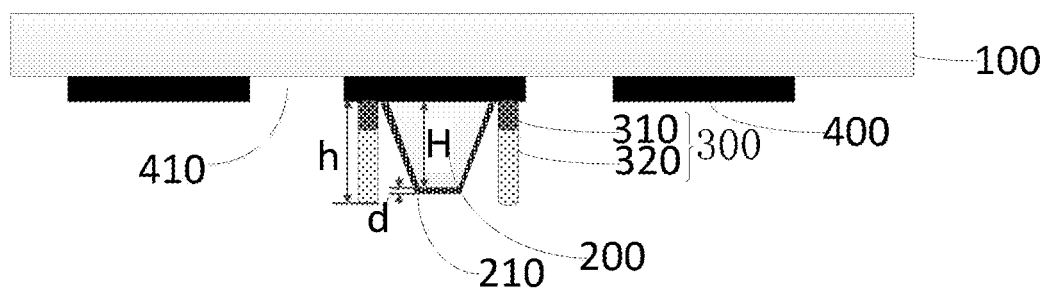
FIG. 3 is a schematic view of a color filter substrate according to yet another embodiment of this disclosure.

According to an embodiment of this disclosure, referring to FIG. 3, the color filter substrate may further comprise a black matrix layer 400. The black matrix layer 400 is arranged between the substrate 100 and the spacers 200. Besides, the black matrix layer 400 further comprises a plurality of openings 410 spaced apart from each other. An orthogonal projection of each spacer 200 and the elastic support 300 in the periphery thereof on the substrate 100 is covered by an orthogonal projection of a portion of the black matrix layer between two adjacent openings 410 on the substrate 100. The spacer and the elastic supports in the periphery thereof are all arranged on a side of the black matrix layer facing away the substrate. In this way, light exiting the color substrate will not be affected and a better usage performance can be ensured.

Figure 4:
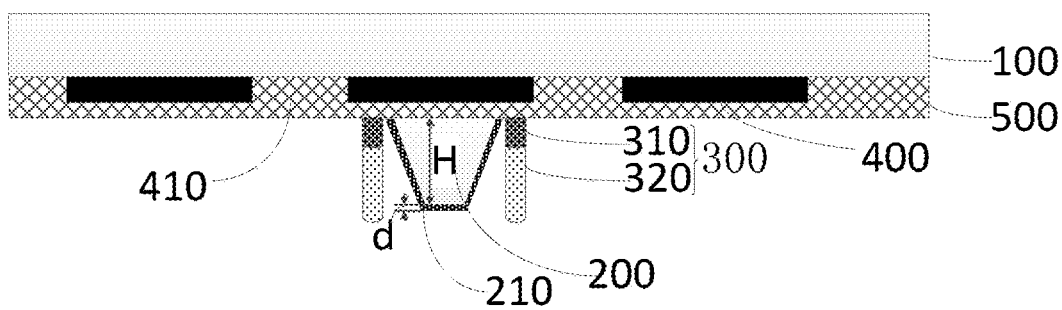
FIG. 4 is a schematic view of a color filter substrate according to still another embodiment of this disclosure.

According to an embodiment of this disclosure, in order to obtain a relatively flat surface of the black matrix layer, referring to FIG. 4, the color filter substrate may further comprise a planarization layer 500. The planarization layer 500 fills the space between the black matrix layer 400 and the spacers 200 and covers the black matrix layer 400. The elastic supports 300 and the spacers 200 can be both arranged on a surface of the planarization layer 500 facing away the substrate 100. It should be noted that the material for forming the planarization layer is a conventional material, for example, comprising but being not limited to transparent optical adhesive or the like, which will not be detailed for simplicity.

According to an embodiment of this disclosure, the number of the spacers is not specially limited. Those skilled in the art should understand that the drawings herein are only illustrated exemplarily by showing one spacer, but this cannot be construed as limiting this disclosure in any sense. In fact, the color filter substrate may further comprise a plurality of spacers. Moreover, these spacers may be arranged flexibly upon actual needs. The material for forming the spacers is a conventional material, which will not be detailed herein for simplicity. As an example, the electrodes on the lower surface of the spacers can be formed of metals such as AlNd or Ag, which have a good conducting effect. Although the drawings herein are only illustrated exemplarily by showing two elastic supports, this cannot be construed as limiting this disclosure in any sense. As for the specific number of the elastic supports, those skilled in the art can make a choice flexibly upon actual needs according to the teaching of this disclosure.

According to another aspect of this disclosure, another embodiment provides a display panel. According to an embodiment of this disclosure, the display panel comprises the color filter substrate mentioned previously. Such a display panel has a simple structure and is easy to be fabricated. Further, an uniform display brightness, a high display image quality and a good usage performance can be achieved.

Figure 5:
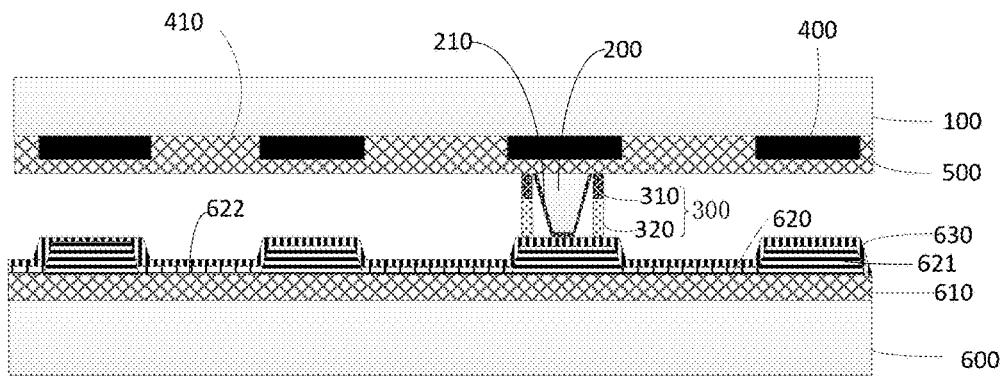
FIG. 5 is a schematic view of a display panel according to an embodiment of this disclosure.

According to an embodiment of this disclosure, in addition to the color filter substrate, the display panel may comprise an array substrate. That is, by aligning and assembling the color filter substrate with the array substrate, the display panel can be formed. Specifically, referring to FIG. 5, the display panel comprises: a first substrate (e.g., the substrate discussed with reference to FIGS. 1-4) 100 and a second substrate 600 opposite to each other; and a black matrix layer 400, a planarization layer 500, at least one spacer 200, at least two elastic supports 300, a cathode 630, a pixel defining layer 621 and a thin film transistor array 610 between the first substrate 100 and the second substrate 600. The black matrix layer 400 is arranged on a surface of the first substrate 100 facing the second substrate 600, and comprises a plurality of first openings (e.g., the opening described with reference to FIGS. 1-4) 410 arranged at intervals. The planarization layer 500 is arranged on a surface of the black matrix layer 400 facing away the first substrate 100 and covers the black matrix layer 400. The at least one spacer 200 is arranged on a surface of the planarization layer 500 facing away the first substrate 100 and provided with electrodes 210 on a lower surface thereof. The at least two elastic supports 300 are arranged on a surface of the planarization layer 500 facing away the first substrate 100, and at least two of the elastic supports 300 are arranged in the periphery of each of the spacers 200. In particular, the at least two elastic supports 300 are arranged evenly along the periphery of the spacer 200. The thin film transistor array 610 is arranged on a surface of the second substrate 600 facing the first substrate 100. The pixel defining layer 621 is arrange on a surface of the thin film transistor array 610 facing away the second substrate 600, and comprises a plurality of second openings 622. Moreover, an orthogonal projection of the pixel defining layer 621 on the substrate 100 covers an orthogonal projection of the black matrix layer 400 on the substrate 100, and an orthogonal projection of the second opening 622 on the substrate 100 covers an orthogonal projection of the first opening 410 on the substrate 100. Besides, in the second opening 622, an OLED light emitting layer and an anode of an OLED light emitting element 620 are provided. The cathode 630 is arranged on a surface of the OLED light emitting element 620 facing away the second substrate 600, and covers the OLED light emitting element 620 and the pixel defining layer 621. In this display panel, i.e., after the color filter substrate is aligned and assembled with the array substrate, the elastic support 300 will be in a contraction state and an elastic force towards the cathode 630 can be maintained. In this case, the height of the contracted elastic support 300 will equal the sum of the height of the spacer 200 and the thickness of the electrode 210. Finally, the electrode 210 of the color filter substrate can be at least partly brought into contact with the cathode 630 of the array substrate. The above display panel has a simple structure and is easy to be fabricated. Meanwhile, with the elastic supports, the electrodes of the color filter substrate and the cathodes of the array substrate will hardly be damaged by the spacers during the aligning and assembling process. Besides, the elastic supports will hardly damage the cathodes. Thereby, a good contact effect between the electrode on each spacer and a corresponding cathode of the array substrate can be realized, and thus a phenomenon of unevenness in the displayed image is reduced to a large extent, which ensures a high display quality of the entire display panel and a good usage performance. According to an embodiment of this disclosure, the material for forming the cathodes can be indium tin oxide (ITO), indium zinc oxide (IZO) and so on.

Figure 6:
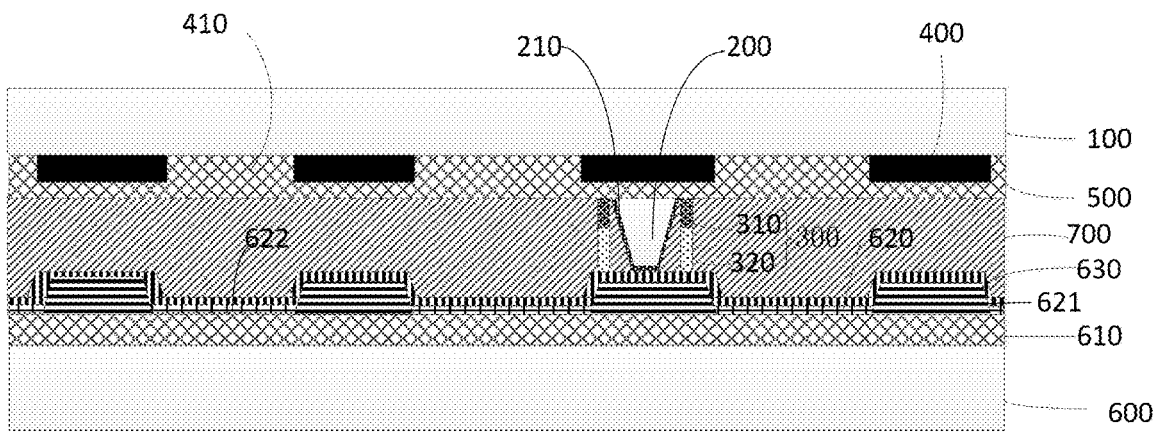
FIG. 6 is a schematic view of a display panel according to another embodiment of this disclosure.

According to an embodiment of this disclosure, referring to FIG. 6, a filling layer 700 may be further arranged between the color filter substrate and the array substrate. The filling layer 700 is located between the cathode 630 and the planarization layer 500, and is at least partly in contact with the electrodes 210 and the elastic supports 300. Thereby, the filling layer can have an encapsulation function. The material for forming the filling layer can be photoresist or glass, which will not be detailed herein for simplicity.

According to an embodiment of this disclosure, the display panel is an OLED display panel, which may either comprise a color filter, or not. In addition to the color filter substrate and the array substrate, the display panel may further comprise an encapsulant, an electrode line and so on, which will not be detailed herein for simplicity.

Figure 7:
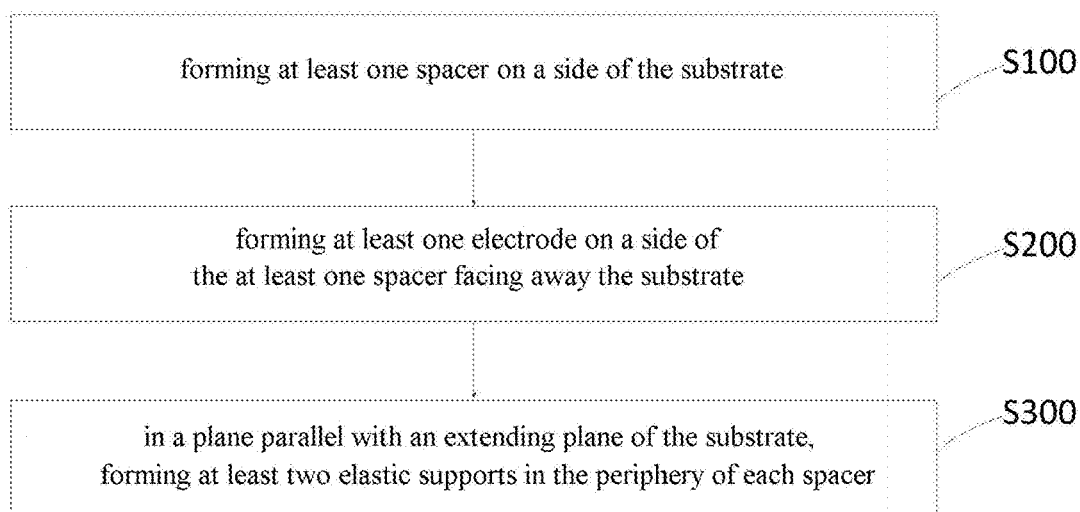
FIG. 7 is a flow chart of a method for manufacturing a color filter substrate according to an embodiment of this disclosure.

According to yet another aspect of this disclosure, a method for manufacturing a color filter substrate is proposed. According to an embodiment of this disclosure, referring to FIG. 7, the method comprises the following steps.

S100: forming at least one spacer on one side of the substrate.

According to an embodiment of this disclosure, the spacers are the same as the spacers described with reference to FIGS. 1-6, which will not be detailed herein for simplicity. According to an embodiment of this disclosure, a process for forming spacers may comprise photolithography or the like. According to a specific embodiment of this disclosure, forming the spacers may comprise depositing a layer of insulating material on a side of the planarization layer facing away the substrate, and patterning the layer of insulating material to form the spacers. The specific patterning method may comprise etching or the like.

Besides, according to an embodiment of this disclosure, prior to forming the spacers, a black matrix layer and a planarization layer may be formed on the substrate. The method for forming a black matrix and a planarization layer is a conventional method, which will not be detailed herein for simplicity.

S200: forming at least one electrode on one side of the at least one spacer facing away the first substrate.

According to an embodiment of this disclosure, the electrodes are the same as the electrodes 210 described with reference to FIGS. 1-6, which will not be detailed herein for simplicity. According to a specific embodiment of this disclosure, the method for forming the electrodes may comprise forming a layer of electrically conductive material on a surface of the planarization layer facing away the substrate by magnetron sputtering, thermal evaporation, electroplating and so on, such that the layer of electrically conductive material covers the spacers, and patterning the layer of electrically conductive material to obtain the at least one electrode. The specific patterning method may comprise etching or the like.

S300: in a plane parallel with an extending plane of the first substrate, forming, in particular evenly, at least two elastic supports in the periphery of each of the spacers.

According to an embodiment of this disclosure, the elastic supports and the spacers are arranged on the same side of the substrate. Specifically, the elastic supports are arranged on a surface of the planarization layer facing away the substrate, and the height of the elastic support is greater than the sum of the height of the spacer and the thickness of a corresponding electrode.

According to an embodiment of this disclosure, the elastic supports are the same as the elastic supports described with reference to FIGS. 1-6, which will not be detailed herein for simplicity.

Figure 8:
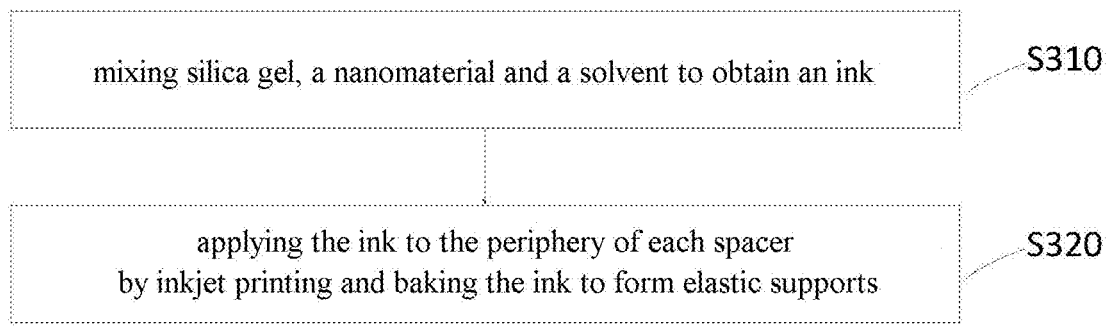
FIG. 8 is a flow chart of manufacturing an elastic support according to an embodiment of this disclosure.

According to an embodiment of this disclosure, referring to FIG. 8, forming the at least two elastic supports comprises the following sub-steps.

S310: mixing silica gel, a nanomaterial and a solvent to obtain an ink.

According to an embodiment of this disclosure, in order that the elastic supports finally obtained have a good performance, the ink contains 5-10% of the nanomaterial and 30-40% of the silica gel in percentage by mass, and the rest is all the solvent. Thereby, after inkjet printing and drying process, the elastic supports have a satisfying supporting effect, a suitable elasticity and a good use performance.

According to an embodiment of this disclosure, the nanomaterial is selected from at least one of nanopillars and nanospheres. Moreover, the nanopillars or the nanospheres are the same as those described above, which will not be repeated herein for simplicity. As an example, the solvent may be selected from aromatic solvents (for example, cyclohexylbenzene, etc.), cyclohexanol, or ethers, etc.

S320: applying the ink to the periphery of each of the spacers by inkjet printing and baking it to form the elastic supports.

According to an embodiment of this disclosure, the inkjet amount for forming each elastic support may be 10-100 picoliters. Thereby, the resultant elastic supports have a suitable height and a good usage performance. Since the nanomaterial has a higher density, it will be deposited by gravity on the surface of the planarization layer facing away the substrate. The solvent can volatilize completely by baking the ink at 100□. Finally, the silica gel coats the outer surface of the nanomaterial, thereby forming an elastic support with a rigid segment and an elastic segment. The above operation is simple, convenient and easy to be implemented with high accuracy. Therefore, an elastic support with a suitable elasticity and a good supporting effect can be obtained.

The inventors have found that the method for manufacturing a color filter substrate is simple, convenient and easy to be implemented. In addition, during the aligning and assembling process of the resultant color filter substrate and an array substrate, the spacers can be effectively prevented from damaging the electrodes of the color filter substrate or the cathodes of the array substrate. Therefore, a good connection effect can be achieved between the electrodes of the color filter substrate and the cathodes of the array substrate.

According to an embodiment of this disclosure, by aligning and assembling the color filter substrate manufactured by means of the above method with an array substrate at 80 □ in a vacuum environment, a display panel with a high yield can be obtained. Moreover, the unevenness of the display brightness of the display panel can be improved, which leads to a high image quality and a good usage performance.

According to an embodiment of the disclosure, in order to reduce the consumption of an external circuit, the connection between the external circuit and the cathodes of the array substrate is assisted by forming spacers. But the elasticity of the spacers is restricted due to the presence of a filling layer, which results in damage to the electrodes of the color filter substrate or the cathodes of the array substrate by the spacers during the aligning and assembling process or other contact failures. However, by arranging at least two elastic supports (especially elastic supports arranged at even intervals) in the periphery of each spacer, damage by the spacers to the electrodes of the color filter substrate or the cathodes of the array substrate can be prevented effectively. Therefore, a satisfying protection effect is provided, and an effective connection between the external circuit and the cathodes of the array substrate can be realized such that a good usage performance is obtained.

It should be understood that in the description of this disclosure, orientational or positional relationships indicated by terms such as "center", "longitudinal", "transversal", "length", "width", "thickness", "up", "down", "front", "back", "left", "right", "vertical", "horizontal", "top", "bottom", "inner", "outer", "clockwise", "counter-clockwise", "axial", "radial" and "circumferential" are all based on the drawings. The purpose is only to describe this disclosure and/or simplify the description, rather than to indicate or imply that the involved device or element must be orientated specifically, or constructed and operated in a specific orientation, so they cannot be understood as limiting the contents of this disclosure in any sense.

Besides, terms such as "first" and "second" are only used for descriptive purposes and should not be understood as indicating or implying relative importance or hinting the number of the involved technical features. Therefore, features defined by "first" and "second" may indicate explicitly or implicitly that one or more such features are comprised. In the description of this disclosure, unless otherwise defined, "multiple" means two or more.

In this disclosure, unless explicitly prescribed or defined otherwise, terms such as "mounting", "linking", "connecting" and "fixing" should be understood in a broad sense. For example, they can be fixed connection, or detachable connection, or integrated connection. Alternatively, they can also be mechanical connection or electrical connection. Furthermore, they can also be direct connection, or indirect connection via an intermediate medium. Obviously, they can also mean communication between two inside elements or interaction between two elements. For one having ordinary skills in the art, the specific meanings of these terms in this disclosure can be understood according to specific situations.

In this disclosure, unless explicitly prescribed or defined otherwise, a first feature being "on" or "under" a second feature can mean either the first feature is in direct contact with the second feature, or the first feature is in indirect contact with the second via an intermediate medium. Moreover, the first feature being "above", "over" and "on top of" the second feature can mean that the first feature is right above or diagonally above the second feature, or simply that a height of the first feature is higher than that of the second feature. Moreover, the first feature being "below", "underneath" and "beneath" the second feature can mean that the first feature is right below or diagonally below the second feature, or simply that the height of the first feature is smaller than that of the second feature.

In the description of this specification, referential descriptions such as "an embodiment", "some embodiments", "an example", "a specific example" or "some examples" mean that specific features, structures, materials or characteristics described by the embodiment(s) or example(s) are comprised in at least one embodiment or example of this disclosure. In this specification, schematic expressions of the above terms are not necessarily directed to the same embodiment(s) or example(s). Moreover, the described specific features, structures, materials or characteristics can be combined suitably in any one or more embodiments or examples. Besides, where no contradiction is introduced, those skilled in the art can combine different embodiments or examples described in this specification and combine the features of different embodiments or examples.

Although embodiments of this disclosure have been provided and described above, it can be understood that the embodiments are exemplarily and cannot be construed as limiting this disclosure in any sense. One having an ordinary skill in the art can make changes, modifications, substitutions and variances to the above embodiments within the scope of this disclosure.

The invention claimed is:

1. A display substrate, comprising:
a first substrate;

at least one spacer on a side of the first substrate;
at least one electrode on a side of the at least one spacer facing away from the first substrate; and
at least two supports on the side of the first substrate,
wherein in a plane parallel with an extending plane of the first substrate, a periphery of each of the at least one spacer comprises the at least two supports, and
wherein in a direction perpendicular to the extending plane of the first substrate, a sum of a height of the at least one spacer and a thickness of the at least one electrode on the respective one of the at least one spacer is less than a height of each of the at least two supports in the periphery of each of the at least one spacer.

2. The display substrate according to claim 1,
wherein in the plane parallel with the extending plane of the first substrate, the at least two supports are evenly distributed in the periphery of each of the at least one spacer.

3. The display substrate according to claim 2,
wherein each support of the at least two supports comprises a rigid segment and an elastic segment connected with each other, and
wherein the rigid segment is closer to the first substrate than the elastic segment.

4. The display substrate according to claim 1,
wherein each support of the at least two supports comprises a rigid segment and an elastic segment connected with each other, and
wherein the rigid segment is closer to the first substrate than the elastic segment.

5. The display substrate according to claim 4,
wherein in the direction perpendicular to the extending plane of the first substrate, a height of the rigid segment is ¼ to ⅓ of a height of the each support.

6. The display substrate according to claim 4,
wherein the rigid segment comprises silica gel and a nanomaterial,
wherein the nanomaterial comprises at least one of nanopillars and nanospheres, and
wherein the elastic segment comprises silica gel.

7. The display substrate according to claim 4,
wherein in the plane parallel with the extending plane of the first substrate, a distance between each of the at least one spacer and the support in the periphery is in a range of 0-0.5 micrometers.

8. The display substrate according to claim 4,
wherein in the direction perpendicular to the extending plane of the first substrate, the sum of the height of the at least one spacer and the thickness of the at least one electrode on the at least one spacer is 0.3-0.5 micrometers less than the height of the support in the periphery of each of the at least one spacer.

9. The display substrate according to claim 4,
wherein in the plane parallel with the extending plane of the first substrate, the each support has a size of 5-10 micrometers.

10. The display substrate according to claim 1, further comprising:
a black matrix layer between the first substrate and the at least one spacer, the black matrix layer comprising a plurality of first openings spaced apart from each other,
wherein an orthogonal projection of a portion of the black matrix layer between two adjacent first openings of the plurality of first openings on the first substrate overlaps an orthogonal projection of each of the at least one spacer and the at least two supports in the periphery of each of the at least one spacer on the first substrate.

11. A display panel, comprising the display substrate according to claim 1.

12. The display panel according to claim 11, wherein the display substrate comprises a color filter substrate, and wherein the display panel further comprises:
an array substrate opposite to the color filter substrate,
wherein the array substrate comprises a second substrate, a thin film transistor array, a pixel defining layer and a cathode layer stacked sequentially in a direction towards the color filter substrate,
wherein the pixel defining layer comprises a plurality of second openings, each second opening of the plurality of second openings is provided with an anode and an organic light emitting layer stacked on each other, and
wherein the at least one electrode of the color filter substrate is in contact with the cathode layer of the array substrate due to a contraction of the at least two supports.

13. The display panel to claim 11, wherein in the plane parallel with the extending plane of the first substrate, the at least two supports are evenly distributed in the periphery of each of the at least one spacer.

14. The display panel according to claim 13,
wherein each support of the at least two supports comprises a rigid segment and an elastic segment connected with each other, and
wherein in the direction perpendicular to the extending plane of the first substrate, a height of the rigid segment is ¼ to ⅓ of the height of the support.

15. The display panel according to claim 13,
wherein each support of the at least two supports comprises a rigid segment and an elastic segment connected with each other,
wherein the rigid segment comprises silica gel and a nanomaterial,
wherein the nanomaterial comprises at least one of nanopillars and nanospheres, and
wherein the elastic segment comprises silica gel.

16. The display panel according to claim 11,
wherein each support of the at least two supports comprises a rigid segment and an elastic segment connected with each other, and
wherein the rigid segment is closer to the first substrate than the elastic segment.

17. A method for manufacturing a display substrate, comprising:
forming at least one spacer on a side of a first substrate;
forming at least one electrode on a side of the at least one spacer facing away from the first substrate; and
forming, in a plane parallel with an extending plane of the first substrate, at least two supports in a periphery of each of the at least one spacer,
wherein in a direction perpendicular to the extending plane of the first substrate, a sum of a height of the at least one spacer and a thickness of the at least one electrode on the at least one spacer is less than a height of each of the at least two supports in the periphery of each of the at least one spacer.

18. The method according to claim 17, wherein the forming the at least two supports comprises arranging the at least two supports evenly in the periphery of each of the at least one spacer.

19. The method according to claim 17, wherein the forming the at least two supports comprises:
mixing silica gel, a nanomaterial and a solvent to obtain an ink, and applying the ink to the periphery of each of the at least one spacer by inkjet printing and baking the ink to form the at least two supports, wherein the nanomaterial comprises at least one of nanopillars and nanospheres.

20. The method according to claim 19, wherein the ink contains 5-10% of the nanomaterial and 30-40% of the silica gel in percentage by mass, and a remainder of the ink is the solvent.

\* \* \* \* \*